United States Patent
Peng et al.

(10) Patent No.: US 9,468,125 B2
(45) Date of Patent: Oct. 11, 2016

(54) ELECTRONIC DEVICE

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Wen-Tang Peng, New Taipei (TW); Hai-Chen Zhou, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 59 days.

(21) Appl. No.: 14/525,683

(22) Filed: Oct. 28, 2014

(65) Prior Publication Data

US 2015/0271943 A1    Sep. 24, 2015

(30) Foreign Application Priority Data

Mar. 18, 2014   (CN) .......................... 2014 1 0099616

(51) Int. Cl.
*H05K 7/14*   (2006.01)
*G11B 33/12*  (2006.01)

(52) U.S. Cl.
CPC ........... *H05K 7/1487* (2013.01); *G11B 33/128* (2013.01)

(58) Field of Classification Search
None
See application file for complete search history.

(56) References Cited

U.S. PATENT DOCUMENTS

| | | | | |
|---|---|---|---|---|
| 5,121,296 A | * | 6/1992 | Hsu .......................... | G06F 1/183 361/679.35 |
| 5,584,396 A | * | 12/1996 | Schmitt .................... | H05K 7/16 211/26 |
| 6,373,690 B1 | * | 4/2002 | Buican .................... | G06F 1/181 16/223 |
| 6,469,904 B1 | * | 10/2002 | Vigeant ................... | G06F 1/181 174/378 |
| 6,538,879 B2 | * | 3/2003 | Jiang ....................... | G06F 1/187 211/26 |
| 6,744,626 B2 | * | 6/2004 | Chen ....................... | G06F 1/184 211/26 |
| 6,788,542 B2 | * | 9/2004 | Rumney ............... | H05K 7/1425 361/724 |
| 6,862,174 B2 | * | 3/2005 | Chien .................... | G06F 1/187 248/694 |
| 7,277,277 B2 | * | 10/2007 | Bang ....................... | G06F 1/181 312/223.1 |
| 7,839,633 B2 | * | 11/2010 | Chou .................... | H05K 5/0004 312/223.2 |
| 8,317,279 B2 | * | 11/2012 | Zhang .................. | H05K 7/1489 211/26 |
| 8,472,183 B1 | * | 6/2013 | Ross .................... | H05K 7/1492 361/679.48 |

(Continued)

*Primary Examiner* — Courtney Smith
*Assistant Examiner* — Rashen E Morrison
(74) *Attorney, Agent, or Firm* — Zhigang Ma

(57) ABSTRACT

An electronic device includes an enclosure and a first bracket coupling in the enclosure. The enclosure includes two opposite side walls. The first bracket includes a first shell for mounting a number of hard disk drives and a resilient first latching member. The first shell includes two opposite side plates. Two distal ends of the side plates are rotatably coupled to the side walls of the enclosure. The first latching member is mounted to the distal end of one of the side plate. The first latching member includes a positioning portion abutting against an inner surface of the corresponding side wall, to deform the first latching member.

16 Claims, 7 Drawing Sheets

(56) References Cited

U.S. PATENT DOCUMENTS

| | | | | |
|---|---|---|---|---|
| 9,055,689 | B2* | 6/2015 | Yu | H05K 5/0226 |
| 9,060,441 | B2* | 6/2015 | Jiang | H05K 7/1427 |
| 2003/0053291 | A1* | 3/2003 | Yanagida | G06F 1/181 |
| | | | | 361/679.03 |
| 2003/0210520 | A1* | 11/2003 | Chien | G06F 1/187 |
| | | | | 361/679.33 |
| 2004/0100775 | A1* | 5/2004 | Baker | G11B 33/126 |
| | | | | 361/724 |
| 2005/0270751 | A1* | 12/2005 | Coglitore | H05K 7/1411 |
| | | | | 361/724 |
| 2007/0115627 | A1* | 5/2007 | Carlisi | G06F 1/183 |
| | | | | 361/679.01 |
| 2007/0207720 | A1* | 9/2007 | Henry | H05K 7/20736 |
| | | | | 454/184 |
| 2009/0316350 | A1* | 12/2009 | Hu | H05K 5/03 |
| | | | | 361/679.33 |
| 2010/0007252 | A1* | 1/2010 | Liu | H05K 7/1487 |
| | | | | 312/223.2 |
| 2013/0265725 | A1* | 10/2013 | Harvilchuck | G06F 1/181 |
| | | | | 361/720 |
| 2014/0063697 | A1* | 3/2014 | Zhou | H05K 7/1487 |
| | | | | 361/679.01 |

\* cited by examiner

ELECTRONIC DEVICE

FIELD

The subject matter herein generally relates to an electronic device.

BACKGROUND

Electronic devices, such as servers, include a number of hard disk drives mounted in an enclosure of the electronic device.

BRIEF DESCRIPTION OF THE DRAWINGS

Implementations of the present technology will now be described, by way of example only, with reference to the attached figures.

DETAILED DESCRIPTION

Figure 1:
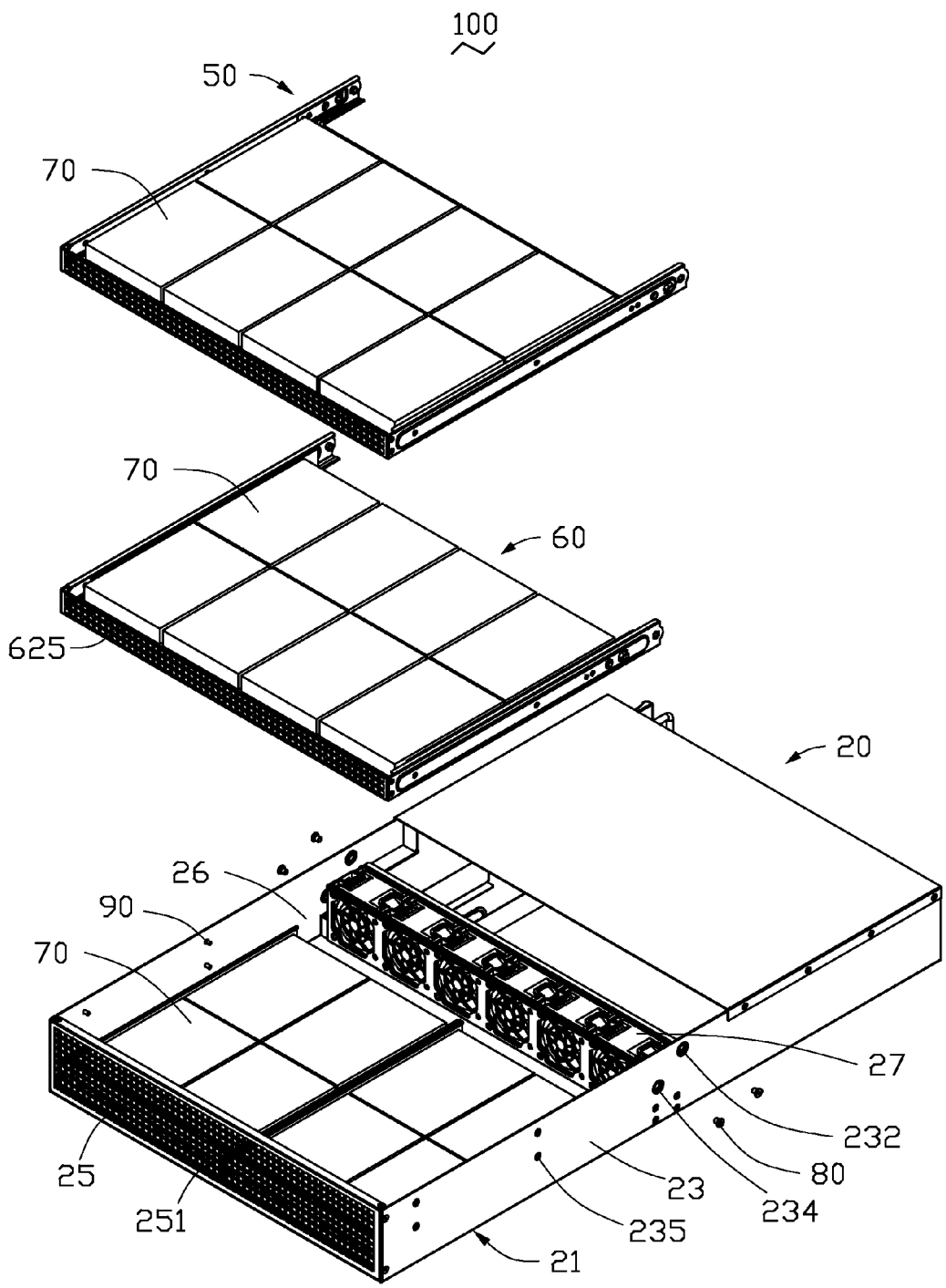
FIG. 1 is an exploded, isometric view of an embodiment of an electronic device, including a first bracket receiving a plurality of hard disk drives and a second bracket receiving a plurality of hard disk drives.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently coupled or releasably coupled. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

The present disclosure is described in relation to an electronic device.

FIG. 1 illustrates an exploded, isometric view of an electronic device 100. The electronic device 100 comprises an enclosure 20, a first bracket 50, a second bracket 60, a plurality of hard disk drives 70, a plurality of shafts 80, and a plurality of fastening members 90. In at least one embodiment, each fastening member 90 is a screw.

The enclosure 20 comprises a substantially rectangular bottom wall 21, two opposite side walls 23 substantially perpendicularly extending up from two opposite sides of the bottom wall 21, and an end wall 25 substantially perpendicularly extending up from an end of the bottom wall 21 and connected between the side walls 23. The bottom wall 21, the side walls 23, and the end wall 25 cooperatively bound a receiving space 26. A row of fans 27 is received in the receiving space 26, and mounted on a middle of the bottom wall 21. The row of fans 27 is perpendicular to the side walls 23. A part of the hard disk drives 70 are received in the receiving space 26, and mounted on the bottom wall 21. The part of the hard disk drives 70 are located between the end wall 25 and the row of fans 27. The end wall 25 defines a plurality of air outlets 251 aligning with the row of fans 27. An upper part of a middle of each side wall 23 defines a first shaft hole 232 and a second shaft hole 234. The first shaft holes 232 of the side walls 23 are opposite each other, and the second shaft holes 234 of the side walls 23 are opposite each other. The second shaft hole 234 is nearer to the bottom wall 21 than the first shaft hole 232, and the second shaft hole 234 is nearer to the end wall 25 than the first shaft hole 232. Each side wall 23 defines a plurality of through holes 235 between the second shaft hole 234 and the end wall 25. In at least one embodiment, the electronic device 100 is a server.

Figure 2:
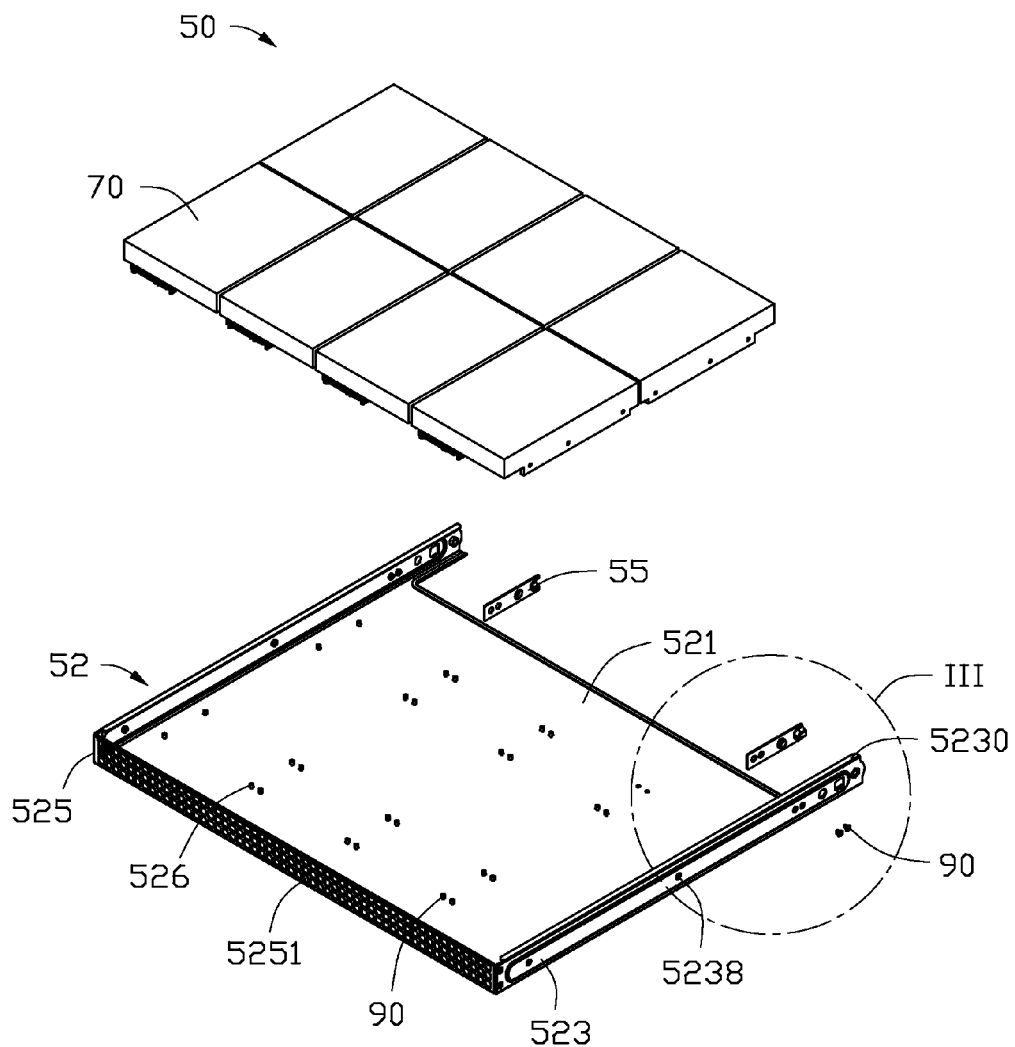
FIG. 2 is an exploded, isometric view of the first bracket and the hard disk drives of the first bracket of FIG. 1.
Figure 3:
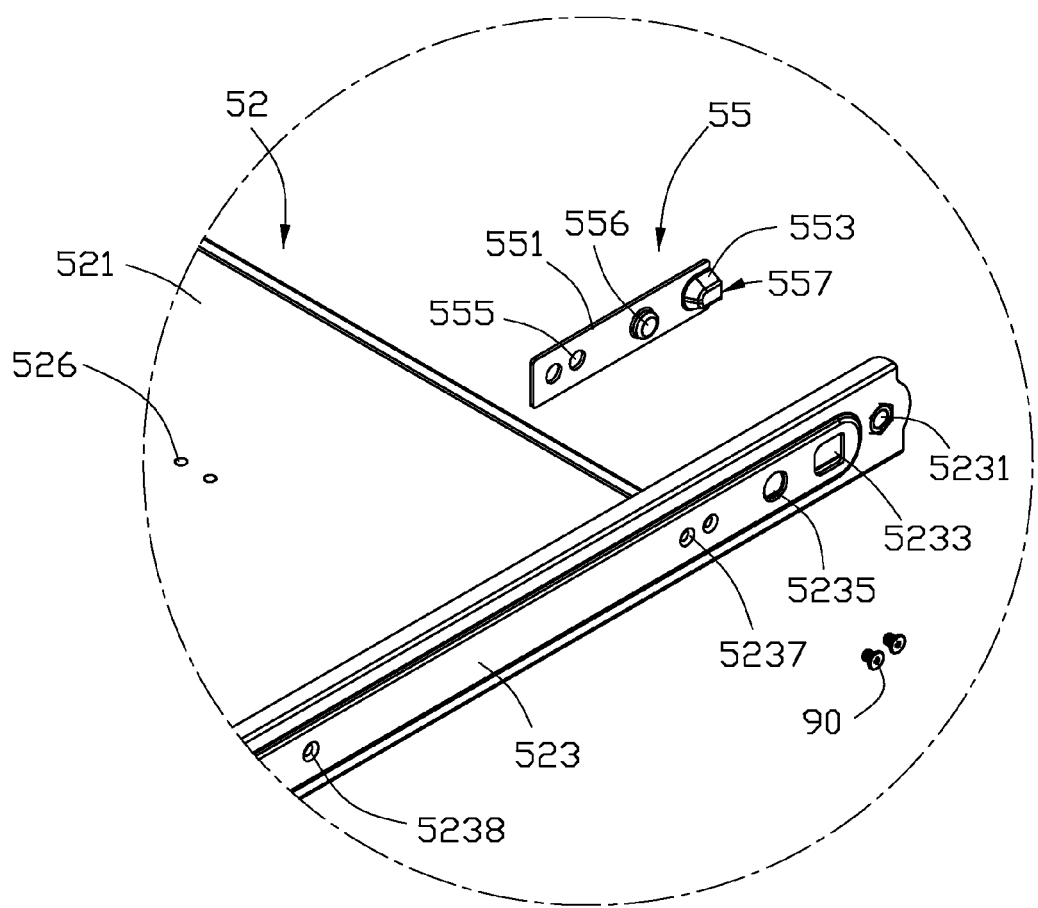
FIG. 3 is an enlarged view of circled portion III of FIG. 2.

FIGS. 2 and 3 illustrate that the first bracket 50 comprises a first shell 52 and two first latching members 55.

The first shell 52 comprises a bottom plate 521, two opposite side plate 523 substantially perpendicularly extending up from two opposite sides of the bottom plate 521, and an end plate 525 substantially perpendicularly extending up from an end of the bottom plate 521 and connected between the side plates 523. The bottom plate 521 defines a plurality of mounting holes 526. A rotating portion 5230 of each side plate 523 away from the end plate 525 is exposed out of the bottom plate 521. The end plate 525 defines a plurality of vents 5251. The rotating portions 5230 of the side plates 523 define two opposite first rotating holes 5231, two opposite positioning holes 5233, two opposite operation holes 5235, and a plurality of connecting holes 5237. The first rotating hole 5231, the positioning hole 5233, the operation hole 5235, and the connecting holes 5237 of each rotating portion 5230 are arranged since a distal end of the rotating portion 5230 to the end plate 525 in that order. Each side plate 523 defines a plurality of latching holes 5238 located between the end plate 525 and the connecting holes 5237.

Each first latching member 55 comprises a substantially rectangular and resilient latching piece 551, a positioning portion 553 protruding from a first end of the latching piece 551, and an operating portion 556 protruding from a middle of the latching piece 551. The positioning portion 553 and the operating portion 556 are located at a same side of the latching piece 551. A second end of the latching piece 551 defines a plurality of installing holes 555 opposite to the positioning portion 553. An end of the positioning portion 553 adjacent to the operating portion 556 forms a position surface 557.

Figure 4:
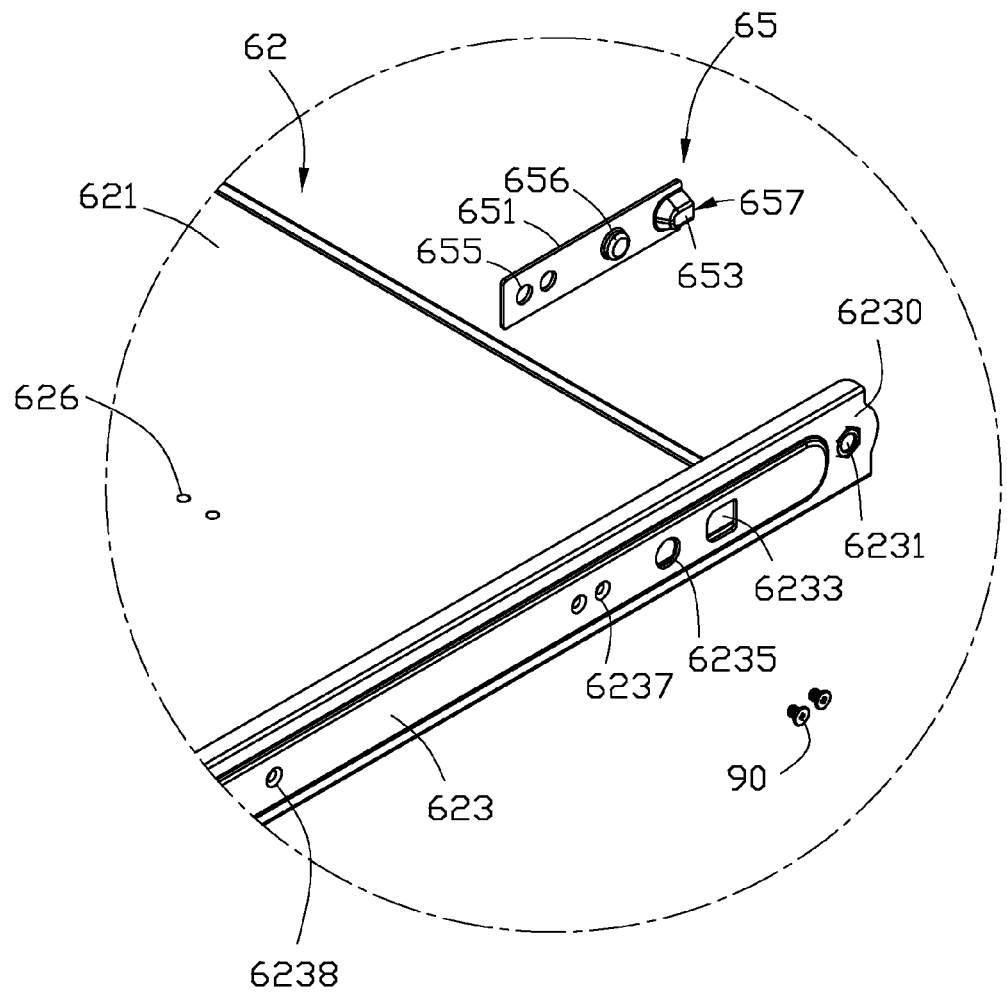
FIG. 4 is a partially exploded, enlarged view of the second bracket of FIG. 1.
Figure 5:
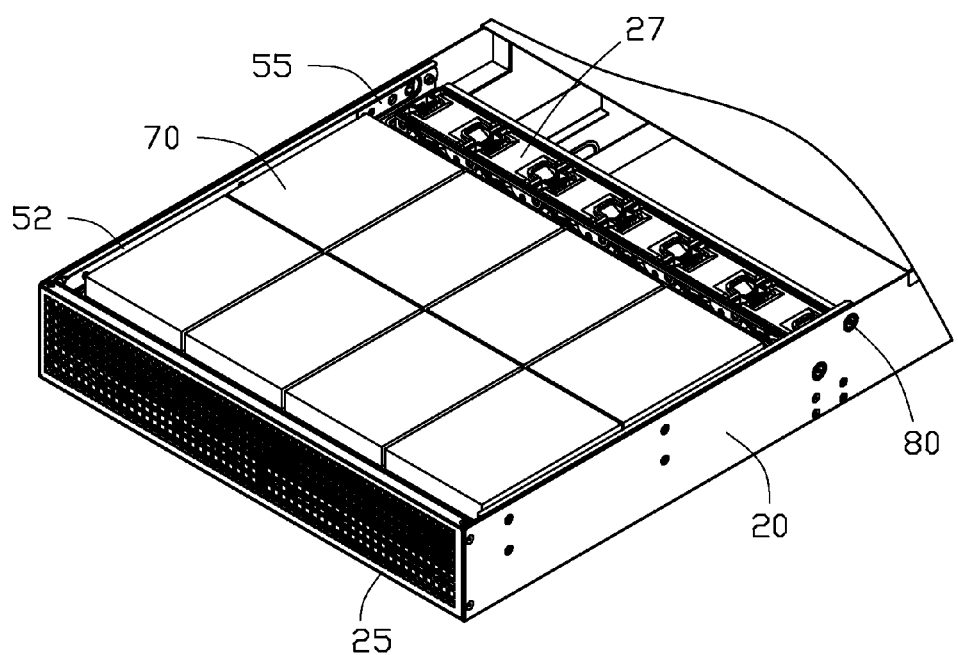
FIG. 5 is an assembled, isometric view of the electronic device of FIG. 1.

Referring to FIG. 4, the second bracket 60 is substantially similar to the first bracket 50, and the second bracket 60 comprises a second shell 62 and two second latching members 65.

The second shell 62 comprises a bottom plate 621, two opposite side plate 623, and an end plate 625 (shown in FIG. 1). The bottom plate 621 defines a plurality of mounting holes 626. A rotating portion 6230 of each side plate 623 away from the end plate 625 is exposed out of the bottom plate 621. The rotating portions 6230 of the side plates 623 define two opposite second rotating holes 6231, two opposite positioning holes 6233, two opposite operation holes 6235, and a plurality of connecting holes 6237. The second rotating hole 6231, the positioning hole 6233, the operation hole 6235, and the connecting holes 6237 of each side plate 623 are arranged since a distal end of the rotating portion 6230 to the end plate 625 in that order. Each side plate 623 defines a plurality of latching holes 6328 located between the end plate 625 and the connecting holes 6237. A distance between the second rotating hole 6231 and the positioning hole 6233 of each side plate 623 is greater than a distance between the first rotating hole 5231 and the positioning hole 5233 of each side plate 523.

Each second latching member 65 comprises a substantially resilient latching piece 651, a positioning portion 653 protruding from a first end of the latching piece 651, and an operating portion 656 protruding from a middle of the latching piece 651. The positioning portion 653 and the operating portion 656 are located at a same side of the latching piece 651. A second end of the latching piece 651 defines a plurality of installing holes 655 opposite to the positioning portion 653. An end of the positioning portion 653 adjacent to the operating portion 656 forms a position surface 657.

Each shaft 80 is made of damping material.

Referring to FIGS. 1-5, in assembly, the latching members 55 are placed to engage with inner surfaces of the side plates 523 of the shell 52. The positioning portion 553 and the operating portion 556 of each latching member 55 are inserted in the positioning hole 5233 and the operation hole 5235 of the corresponding side plate 523, and the installing holes 555 are aligned with the connecting holes 5237 of the side plate 523. A first part of the fastening members 90 extends through the connecting holes 5237 of the side plate 523, to be fastened in the corresponding installing holes 555 of the latching member 55. Thus, the latching members 55 are mounted to the side plates 523. The latching members 65 are placed to engage with inner surfaces of the side plates 623 of the shell 62. The positioning portion 653 and the operating portion 656 of each latching member 65 are inserted in the positioning hole 6233 and the operation hole 6235 of the corresponding side plate 623, and the installing holes 655 are aligned with the connecting holes 6237 of the side plate 623. A second part of the fastening members 90 extends through the connecting holes 6237 of the side plate 623, to be fastened in the corresponding installing hole 655 of the latching member 65. Thus, the latching members 65 are mounted to the side plates 623. The other part of hard disk drives 70 are supported on the bottom plates 521 and 621, and a third part of the fastening members 90 extend through the mounting holes 526 and 626 to be mounted to the hard disk drives 70.

The second bracket 60 installing a part of the hard disk drives 70 is received in the receiving space 26 of the enclosure 20, the second rotating holes 6231 of the second bracket 60 are aligned with the second shaft holes 234 of the enclosure 20, and the bottom plate 621 of the second bracket 60 is supported on the hard disk drives 70 mounted on the bottom wall 21 of the enclosure 20. The positioning portions 653 of the latching members 65 resiliently abut against inner surfaces of the side walls 23, to deform the latching pieces 651 away from the corresponding side walls 23. Two of the shafts 80 extend though the second shaft holes 234, to be inserted into the second rotating holes 6231 of the second bracket 60. Thus, the second bracket 60 can be rotatably connected to the enclosure 20, the latching holes 6238 are aligned with the corresponding through holes 235 of the enclosure 20, and a fourth part of the fastening members 90 extends through the through holes 235 to fasten the corresponding latching hole 6238.

The first bracket 50 installing the other hard disk drives 70 is received in the receiving space 26 of the enclosure 20, the first rotating holes 5231 of the first bracket 50 are aligned with the first shaft holes 232 of the enclosure 20, and the bottom plate 521 of the first bracket 50 is supported on the second bracket 60. The positioning portions 553 of the latching members 55 resiliently abut against inner surfaces of the side walls 23, to deform the latching pieces 551 away from the corresponding side walls 23. Two of the shafts 80 extend though the first shaft holes 232, to be inserted into the first rotating holes 5231 of the first bracket 50. Thus, the first bracket 50 is rotatably connected to the enclosure 20, and the latching holes 5238 are aligned with the corresponding through holes 235 of the enclosure 20, and a fifth part of the fastening members 90 extends through the through holes 235 to fasten the corresponding latching hole 5238.

Figure 6:
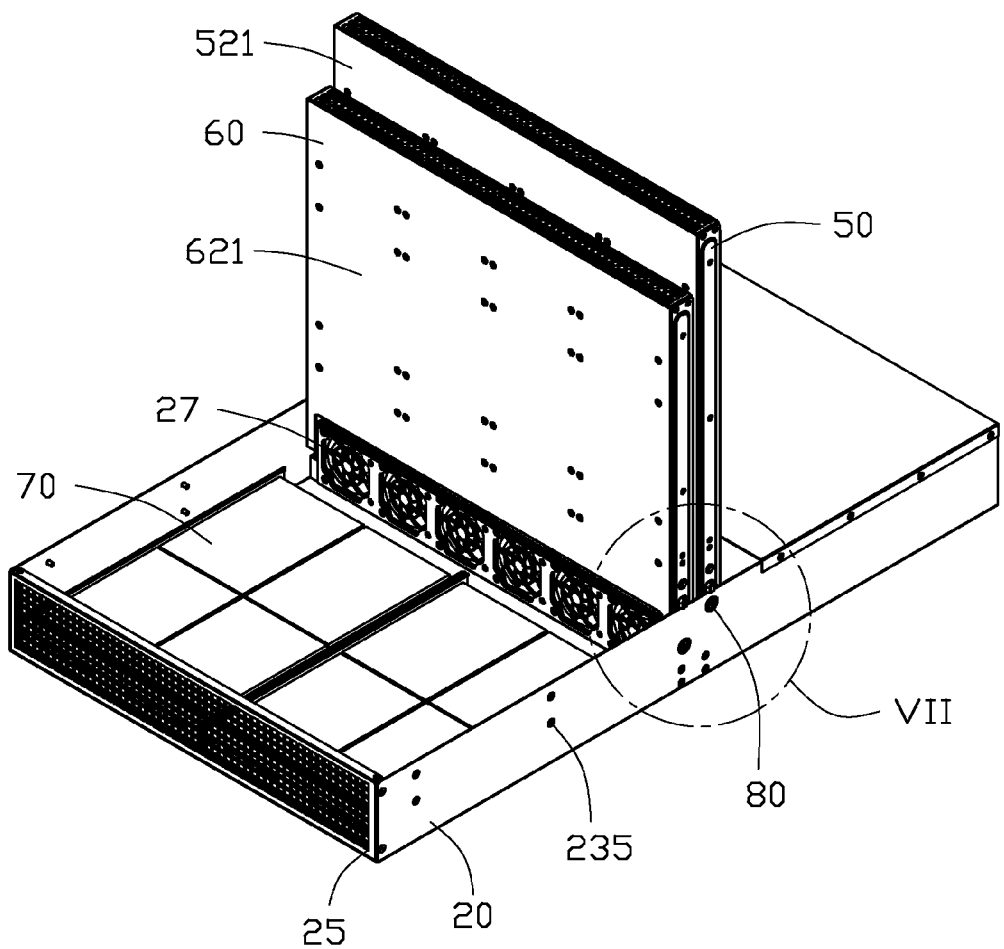
FIG. 6 is similar to FIG. 5, but shows a different state of use.
Figure 7:
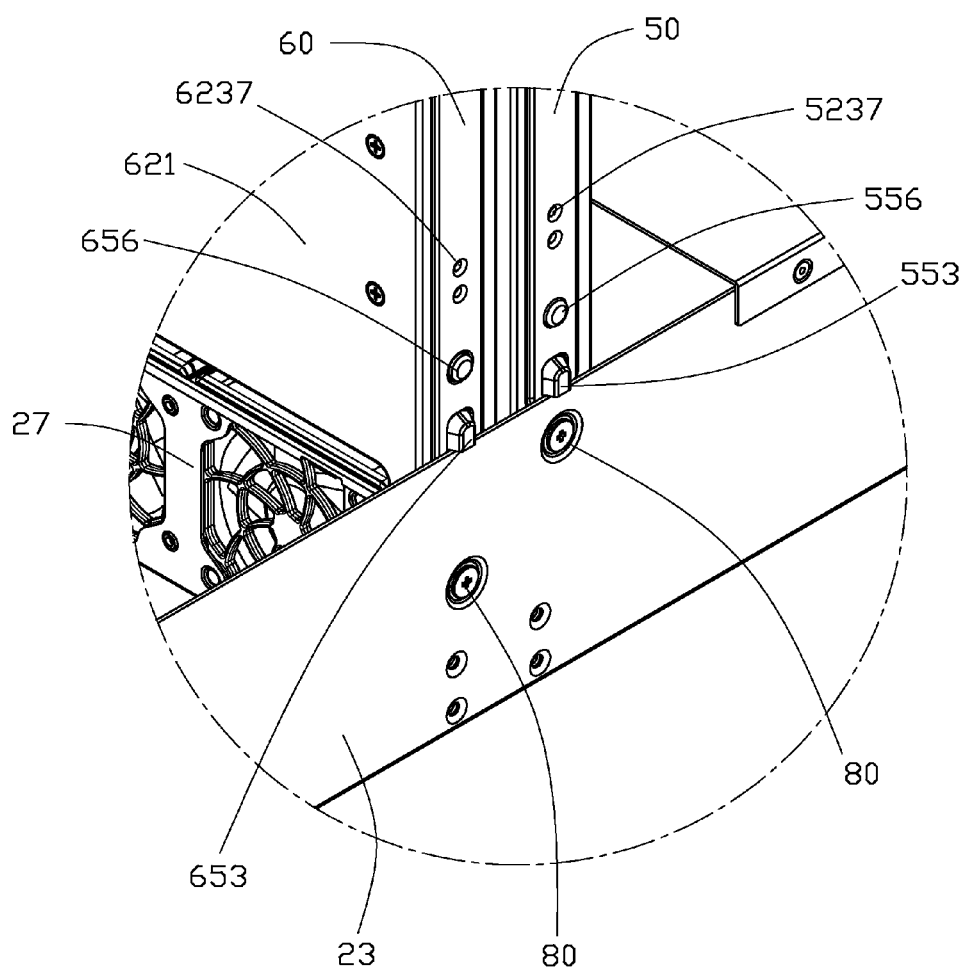
FIG. 7 is an enlarged view of circled portion VII of FIG. 6.

Referring to FIGS. 6 and 7, if one of the hard disk drives 70 mounted to the bottom wall 21, the second bracket 60, or the first bracket 50 needs to be replaced, the fastening members 90 are detached from the side walls 23, the first bracket 50 is pulled up to rotate about the first shaft holes 232. The positioning portion 553 of each latching member 55 slidably abuts against the inner surface of the corresponding side wall 23, until the positioning portion 553 is exposed out of a top edge of the corresponding side wall 23. The latching pieces 551 are restored to bias the operating portions 556 and the positioning portions 553 to extend through the operation holes 5235 and the positioning holes 5233, and to allow the position surfaces 557 of the positioning portions 553 to latch on the top edges of the side walls 23. Thus, the first bracket 50 is substantially perpendicularly positioned to the enclosure 20 for installing or removing the hard disk drives 70 of the first bracket 50. The second bracket 60 is pulled up to rotate about the second shaft holes 234. The positioning portion 653 of each latching member 65 slidably abuts against the inner surface of the corresponding side wall 23, until the positioning portion 653 is exposed out of the top edge of the corresponding side wall 23. The latching pieces 651 are restored to bias the operating portions 656 and the positioning portions 653 to extend through the operation holes 6235 and the positioning holes 6233, and to allow the position surfaces 657 of the positioning portions 653 to latch on the top edges of the side walls 23. Thus, the second bracket 60 is substantially perpendicularly positioned to the enclosure 20 for installing or removing the hard disk drives 70 of the second bracket 60, and it is convenient to install or remove the hard disk drives 70 supported on the bottom wall 21.

The operating portion 656 of each latching member 65 is pressed to receive in the corresponding operation hole 6235, to deform the corresponding latching piece 651, and the positioning surface 657 is detached from the top edge of the corresponding side wall 23. The second bracket 60 is pushed toward the receiving space 26, the second bracket 60 is rotated about the corresponding shafts 80, until the second bracket 60 is supported on the hard disk drives 70 mounted to the bottom wall 21. The operating portion 556 of each latching member 55 is pressed to receive in the corresponding operation hole 5235, to deform the corresponding latching piece 551, and the positioning surface 557 is detached from the top edge of the corresponding side wall 23. The first bracket 50 is pushed toward the receiving space 26, the first bracket 50 is rotated about the corresponding shafts 80, until the first bracket 50 is supported on the hard disk drives 70 mounted to the second bracket 60. The fastening members 90 extend through the through holes 235 to fasten in the corresponding latching holes 5238 and 6238.

Even though numerous characteristics and advantages of the embodiments have been set forth in the foregoing description, together with details of the structure and function of the embodiments, the present disclosure is illustrative only, and changes may be made in detail, including in the matters of shape, size, and arrangement of parts within the principles of the embodiments to the full extent indicated by the broad general meaning of the terms in which the appended claims are expressed.

What is claimed is:

1. An electronic device comprising:
an enclosure comprising two opposite side walls; and
a first bracket coupled in the enclosure, wherein the first bracket comprises a first shell for mounting a plurality of hard disk drives and a resilient first latching member, the first shell comprises two opposite side plates, two distal ends of the side plates are rotatably coupled to the side walls of the enclosure, the first latching member is mounted to the distal end of one of the side plate, the first latching member comprises a positioning portion abutting against an inner surface of the corresponding side wall, to deform the first latching member;
wherein when the first bracket is rotated away from the enclosure, the positioning portion slidably abuts against the inner surface of the side wall, deforming the first latching member, until the positioning portion is exposed out of the corresponding side wall, the first latching member is restored to bias the positioning portion to latch on a top edge of the corresponding side wall, to position the first bracket, the side walls of the enclosure define two opposite first shaft holes, the distal ends of the side plates of the first bracket define two opposite first rotating holes aligning with the first shaft holes, two shafts extend through the first shaft holes to be inserted into the corresponding first rotating holes, the first latching member further comprises a resilient latching piece, a first end of the latching piece is mounted to the inner surface of the corresponding side plate, the positioning portion protrudes from a second end of the latching piece, the side plate defines a positioning hole adjacent to the corresponding first rotating hole, and the positioning portion of the first latching member extends through the positioning hole to abut against the inner surface of the side wall, to deform the latching piece.

2. The electronic device of claim 1, wherein each shaft is made of damping material.

3. The electronic device of claim 1, wherein the side plate mounting the first latching member defines an operation hole adjacent to the positioning hole, the first latching member further comprises an operating portion extending though the operation hole, when the positioning portion is latched on the top edge of the corresponding side wall, the operating portion is pressed away from the side wall, to deform the latching piece, the positioning portion is detached from the top edge of the side wall.

4. The electronic device of claim 1, wherein the enclosure further comprises a bottom wall, the side walls extend from the bottom wall, the bottom wall and the side wall cooperatively bound a receiving space, a plurality of hard disk drives is received in the receiving space and mounted on the bottom wall, the first bracket is received in the receiving space and located above the hard disk drives mounting on the bottom wall.

5. The electronic device of claim 1, further comprising a second bracket received in the enclosure and a plurality of hard disk drives mounted to the second bracket, the second bracket is rotatably coupled between the side walls, and located below the first bracket.

6. The electronic device of claim 5, wherein the second bracket comprises a second shell and a resilient second latching member, the second shell comprises two opposite side plates, two distal ends of the side plates of the second shell are rotatably coupled to the side walls of the enclosure, the second latching member is mounted to the distal end of one of the side plates of the second shell, the second latching member comprises a positioning portion abutting against the inner surface of the corresponding side wall, to deform the second latching member, when the first bracket is rotated away from the enclosure, the second bracket is rotated away from the enclosure, until the positioning portion of the second latching member is exposed out of the corresponding side wall, the second latching member is restored to bias the positioning portion to latch on a top edge of the corresponding side wall, to position the second bracket.

7. The electronic device of claim 6, wherein the enclosure further comprises an end wall connecting between same ends of the side walls, the side walls define two opposite first shaft holes and two opposite second shaft holes, the first shaft holes are nearer to the top edges of the side walls than the second shaft holes, and the first shaft holes are farther away from the end wall than the second shaft holes, the distal ends of the side plates of the first bracket define two opposite first rotating holes aligning with the first shaft holes, the distal ends of the side plates of the second bracket define two opposite second rotating holes aligning with the second shaft holes, four shafts extend through the first and second shaft holes to be inserted into the corresponding first and second rotating holes.

8. The electronic device of claim 1, wherein the first bracket further comprises a bottom plate, the side plates extend from two opposite sides of the bottom plate, the hard disk drives are mounted on the bottom plate, the distal ends of the side plates are exposed out of the bottom plate.

9. An electronic device comprising:
an enclosure comprising two opposing side walls; and
a first bracket coupled to the enclosure, the first bracket comprising:
a first shell for mounting a plurality of hard disk drives, the first shell comprises two opposing side plates with distal ends, the distal ends being rotatably coupled to the opposing side walls of the enclosure; and
a first latching member mounted to the distal end of one of the side plates, the first latching member comprising a positioning portion that abuts against an inner surface of the corresponding side wall to deform the first latching member, the positioning portion slidably abutting against the inner surface of the side wall when the first bracket is rotated within the enclosure, the positioning portion deforming the first latching member until the positioning portion is exposed from the corresponding side wall, the first latching member being restored to a bias position, the positioning portion securing the first bracket by latching to a top edge of the corresponding side wall;

a second bracket received in the enclosure and a plurality of hard disk drives being mounted to the second bracket, the second bracket rotatably coupled between the side walls, and located below the first bracket;

wherein the second bracket comprises a second shell and a resilient second latching member, the second shell comprises two opposite side plates, two distal ends of the side plates of the second shell are rotatably coupled to the side walls of the enclosure, the second latching member is mounted to the distal end of one of the side plates of the second shell, the second latching member comprises a positioning portion abutting against the inner surface of the corresponding side wall, to deform the second latching member, when the first bracket is rotated away from the enclosure, the second bracket is rotated away from the enclosure, until the positioning portion of the second latching member is exposed out of the corresponding side wall, the second latching member is restored to bias the positioning portion to latch on a top edge of the corresponding side wall, to position the second bracket.

10. The electronic device of claim 9, wherein the side walls of the enclosure define two opposite first shaft holes, the distal ends of the side plates of the first bracket define two opposite first rotating holes aligning with the first shaft holes, two shafts extend through the first shaft holes to be inserted into the corresponding first rotating holes.

11. The electronic device of claim 10, wherein each shaft is made of damping material.

12. The electronic device of claim 10, wherein the first latching member further comprises a resilient latching piece, a first end of the latching piece is mounted to the inner surface of the corresponding side plate, the positioning portion protrudes from a second end of the latching piece, the side plate defines a positioning hole adjacent to the corresponding first rotating hole, the positioning portion of the first latching member extends through the positioning hole to abut against the inner surface of the side wall, to deform the latching piece.

13. The electronic device of claim 12, wherein the side plate mounting the first latching member defines an operation hole adjacent to the positioning hole, the first latching member further comprises an operating portion extending though the operation hole, when the positioning portion is latched on the top edge of the corresponding side wall, the operating portion is pressed away from the side wall, to deform the latching piece, the positioning portion is detached from the top edge of the side wall.

14. The electronic device of claim 9, wherein the enclosure further comprises a bottom wall, the side walls extend from the bottom wall, the bottom wall and the side wall cooperatively bound a receiving space, a plurality of hard disk drives is received in the receiving space and mounted on the bottom wall, the first bracket is received in the receiving space and located above the hard disk drives mounting on the bottom wall.

15. The electronic device of claim 9, wherein the enclosure further comprises an end wall connecting between same ends of the side walls, the side walls define two opposite first shaft holes and two opposite second shaft holes, the first shaft holes are nearer to the top edges of the side walls than the second shaft holes, and the first shaft holes are farther away from the end wall than the second shaft holes, the distal ends of the side plates of the first bracket define two opposite first rotating holes aligning with the first shaft holes, the distal ends of the side plates of the second bracket define two opposite second rotating holes aligning with the second shaft holes, four shafts extend through the first and second shaft holes to be inserted into the corresponding first and second rotating holes.

16. The electronic device of claim 9, wherein the first bracket further comprises a bottom plate, the side plates extend from two opposite sides of the bottom plate, the hard disk drives are mounted on the bottom plate, the distal ends of the side plates are exposed out of the bottom plate.

* * * * *